US010985411B2

(12) United States Patent
Sohn et al.

(10) Patent No.: US 10,985,411 B2
(45) Date of Patent: Apr. 20, 2021

(54) APPARATUS AND METHOD FOR MANAGING BATTERY

(71) Applicant: Samsung Electronics Co., Ltd., Suwon-si (KR)

(72) Inventors: Dong Kee Sohn, Seoul (KR); Dae Bong Jung, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1107 days.

(21) Appl. No.: 15/415,128

(22) Filed: Jan. 25, 2017

(65) Prior Publication Data

US 2017/0222274 A1 Aug. 3, 2017

(30) Foreign Application Priority Data

Feb. 3, 2016 (KR) .......................... 10-2016-0013567

(51) Int. Cl.
*H01M 10/42* (2006.01)
*G01R 31/392* (2019.01)
*H01M 10/625* (2014.01)
*H01M 10/48* (2006.01)
*H01M 10/613* (2014.01)
*B60L 58/15* (2019.01)
*H01M 50/20* (2021.01)
*H01M 10/633* (2014.01)
*G01R 31/367* (2019.01)
(Continued)

(52) U.S. Cl.
CPC ........... *H01M 10/425* (2013.01); *B60L 58/15* (2019.02); *G01R 31/392* (2019.01); *H01M 10/48* (2013.01); *H01M 10/486* (2013.01); *H01M 10/613* (2015.04); *H01M 10/625* (2015.04); *H01M 10/633* (2015.04); *H01M 50/20* (2021.01); *G01R 31/367* (2019.01); *G01R 31/374* (2019.01); *H01M 10/659* (2015.04); *H01M 10/6554* (2015.04); *H01M 10/6556* (2015.04); *H01M 2010/4271* (2013.01); *H01M 2220/20* (2013.01)

(58) Field of Classification Search
CPC .. H01M 10/425; H01M 10/613; H01M 10/48; H01M 10/625; H01M 10/486; H01M 2/1077; H01M 10/633; B60L 58/12; G01R 31/392
USPC ........................................................ 702/183
See application file for complete search history.

(56) References Cited

U.S. PATENT DOCUMENTS

2011/0033735 A1 2/2011 Kinoshita et al.
2011/0195316 A1* 8/2011 Morigaki ............ H01M 10/052
429/326
(Continued)

FOREIGN PATENT DOCUMENTS

JP 2004-14462 A 1/2004
JP 2009-76265 A 4/2009
(Continued)

*Primary Examiner* — Paul D Lee
(74) *Attorney, Agent, or Firm* — NSIP Law

(57) ABSTRACT

Disclosed are an apparatus and method for managing a battery. The battery management apparatus includes a thickness calculator configured to calculate a thickness of a battery on the basis of a capacitance of the battery and an information generator configured to generate a battery-state information by subtracting an increase in a thickness of the battery according to temperature of the battery from the calculated thickness.

13 Claims, 7 Drawing Sheets

(51) Int. Cl.
*H01M 10/6554* (2014.01)
*H01M 10/6556* (2014.01)
*H01M 10/659* (2014.01)
*G01R 31/374* (2019.01)

(56) References Cited

U.S. PATENT DOCUMENTS

| | | | |
|---|---|---|---|
| 2014/0333312 A1 | 11/2014 | Schlag et al. | |
| 2014/0351177 A1 | 11/2014 | Park et al. | |
| 2016/0064780 A1* | 3/2016 | Jarvis | H01M 10/48 429/50 |
| 2016/0097820 A1* | 4/2016 | Thompson | G01R 31/374 320/134 |
| 2016/0116548 A1* | 4/2016 | Ghantous | H01M 10/425 702/63 |
| 2016/0322676 A1* | 11/2016 | Jun | H01M 10/486 |

FOREIGN PATENT DOCUMENTS

| | | |
|---|---|---|
| JP | 2012-160301 A | 8/2013 |
| JP | 5403524 B2 | 11/2013 |
| KR | 10-0864536 B1 | 10/2008 |
| KR | 10-1191425 B1 | 10/2012 |
| KR | 10-2014-0042269 A | 4/2014 |
| KR | 10-2014-0137562 A | 12/2014 |
| KR | 10-2014-0144425 A | 12/2014 |
| KR | 10-2015-0049521 A | 5/2015 |
| KR | 10-2015-0066661 A | 6/2015 |
| WO | WO 2008/026476 A1 | 3/2008 |

* cited by examiner

APPARATUS AND METHOD FOR MANAGING BATTERY

CROSS-REFERENCE TO RELATED APPLICATION(S)

This application claims the benefit under 35 U.S.C. § 119(a) of Korean Patent Application No. 10-2016-0013567, filed on Feb. 3, 2016, in the Korean Intellectual Property Office, the entire disclosure of which is incorporated herein by reference for all purposes.

BACKGROUND

1. Field

The following description relates to an apparatus and method for managing a battery.

2. Description of the Related Art

As environmental impact and the finite nature of carbon-based energy resource becoming evident, attention is being paid to electric vehicles as a future transport means. An electric vehicle uses a battery including chargeable/dischargeable secondary cells in one pack as a main power source and thus does not emit exhaust gas and makes very little noise.

In the electric vehicle, a battery serves as the engine and the fuel tank of an equivalent gasoline vehicle. Thus, for safety of users of the electric vehicles, checking and estimating the state of the battery is crucial.

SUMMARY

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

The following description relates to an apparatus and method for managing a battery.

In one general aspect, there is provided a battery management apparatus including a thickness calculator configured to calculate a thickness of a battery based on a capacitance of the battery, and an information generator configured to generate a battery-state information by subtracting an increase in a thickness of the battery according to temperature of the battery from the calculated thickness.

The battery management apparatus may include a capacitance determiner configured to measure the capacitance of the battery through a first frame coupled to a top of the battery and a second frame coupled to a bottom of the battery.

The first frame and the second frame may include one of a cooling channel, a fixed frame, a heat conductive plate, and a phase-change material (PCM) cooling plate.

The information generator may be configured to determine the increase in the thickness of the battery according to the temperature of the battery using temperature-thickness relation information representing a relation between the temperature and the thickness of the battery.

The temperature of the battery may include any one or any combination of a localized temperature, an average temperature, and a temperature distribution of the battery.

The battery management apparatus may include a state estimator configured to estimate a state of the battery based on the battery-state information.

The state of the battery may include one of a state-of-charge (SoC) or a state-of-health (SoH) of the battery.

The state estimator may be configured to estimate the SoC of the battery using SoC-thickness relation information representing a relation between the SoC and the thickness of the battery and to estimate the SoH of the battery using SoH-thickness relation information representing a relation between the SoH and the thickness of the battery.

The first frame and the second frame may be configured to fix a position of the battery.

In another general aspect, there is provided a battery management method including calculating a thickness of a battery based on a capacitance of the battery, and generating battery-state information by subtracting an increase in a thickness of the battery according to temperature of the battery from the calculated thickness.

The method may include measuring the capacitance of the battery through a first frame coupled to a top of the battery and a second frame coupled to coupled to a bottom of the battery.

The first frame and the second frame may include one of a cooling channel, a fixed frame, a heat conductive plate, and a phase-change material (PCM) cooling plate.

The method may include determining the increase in the thickness of the battery according to the temperature of the battery using temperature-thickness relation information representing a relation between the temperature and the thickness of the battery.

The temperature of the battery may include any one or any combination of a localized temperature, an average temperature, and a temperature distribution of the battery.

The method may include estimating a state of the battery based on the battery-state information.

The state of the battery may include one of a state-of-charge (SoC) or a state-of-health (SoH) of the battery.

The estimating of the state of the battery may include estimating the SoC of the battery using SoC-thickness relation information representing a relation between the SoC and the thickness of the battery, or estimating the SoH of the battery using SoH-thickness relation information representing a relation between the SoH and the thickness of the battery.

In another general aspect, there is provided a battery management apparatus including a processor configured to calculate a thickness of a battery based on a capacitance of the battery, and generate a battery-state information by subtracting an increase in a thickness of the battery according to temperature of the battery from the calculated thickness.

The capacitance of the battery may be determined using a first frame coupled to a top of the battery, a second frame coupled to a bottom of the battery, and a third frame coupled to a side of the battery, and the temperature of the battery may be determined using one or more temperature sensors attached to the battery.

Other features and aspects will be apparent from the following detailed description, the drawings, and the claims.

Figure 1:
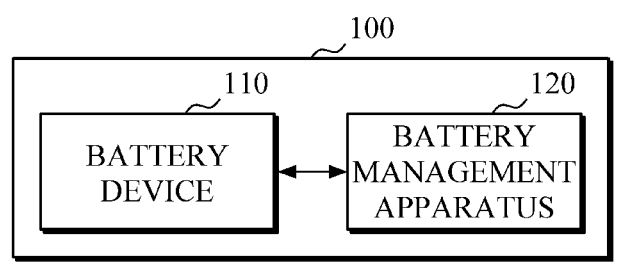
FIG. 1 is a diagram illustrating an example of a battery apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or apparatuses described herein. However, various changes, modifications, and equivalents of the methods, apparatuses, and/or apparatuses described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or apparatuses described herein that will be apparent after an understanding of the disclosure of this application.

Figure 2:
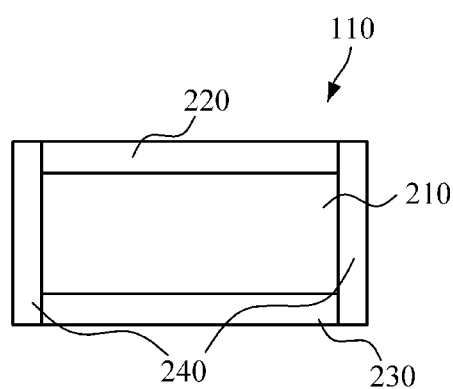
FIG. 2 is a diagram illustrating an example of a battery device.

FIG. 1 is a diagram illustrating an example of a battery apparatus 100. FIG. 2 is a diagram illustrating an example of a battery device 110. Referring to FIG. 1, the battery apparatus 100 includes the battery device 110 and a battery management apparatus 120.

In an example, the battery device 110 supplies power to an apparatus in which the battery apparatus 100 is installed. In an example, as illustrated in FIG. 2, the battery device 110 includes a battery 210, a first frame 220, a second frame 230, and a third frame 240.

In an example, the battery 210 includes battery modules connected in series and/or in parallel. Each of the battery modules may include battery cells connected in series and/or in parallel. In an example, each of the battery modules or each of the battery cells may be a secondary cell including a battery, such as, for example, nickel metal battery, a lithium ion battery, and a lithium-ion phosphate battery. The capacities of the battery modules or the plura battery cells may be the same or different.

In an example, the first frame 220 is affixed to the top of the battery 210 to fix the battery 210. In an example, the second frame 230 is affixed to the bottom of the battery 210 to fix the battery 210. In an example, the third frame 240 affixed to side surfaces of the battery 210 to fix the battery 210. In an example, the first frame 220, the second frame 230, and the third frame 240 are closely affixed to the top, the bottom, and the side surfaces of the battery 210, respectively.

In one embodiment, the first frame 220 and the second frame 230 are electro-conductive electrodes that are used to measure a capacitance of the battery 210. In an example, the first frame 220 and the second frame 230 may each be embodied as a cooling channel, a fixed frame, a heat conductive plate, a phase-change material (PCM) cooling plate, or the like.

The battery management apparatus 120 may monitor the state of the battery 210 and manage the battery 210 based on a result of monitoring the state of the battery 210.

The battery management apparatus 120 may estimate various states of the battery, such as, for example, a state-of-charge (SoC), a state-of-health (SoH), of the battery 210 on the basis of data sensed from the battery 210. In an example, the data sensed from the battery 210 is one or more of temperature, voltage, current, or capacitance of the battery 210. In an example, the SoC may be information regarding a charge rate representing the amount of electric charges charged in the battery 210. The SoH may be information regarding the degree of deterioration of the performance of the battery 210 compared to the performance of the battery 210 at manufacturing.

In an example, the battery management apparatus 120 may estimate the SoC of the battery 210 using techniques, such as, for example, Coulomb counting, equivalent circuit modeling, electrochemistry modeling, or data-based technique. However, the above methods are merely examples, and other methods may be used without departing from the spirit and scope of the illustrative examples described. The battery management apparatus 120 may estimate the SoC of the battery 210 using various other methods.

In an example, the battery management apparatus 120 may estimate the SoH of the battery 210 using techniques, such as, for example, an open-circuit voltage (OCV) technique of estimating the SoC of the battery 210 by sensing an open-circuit voltage, or an electrochemical impedance spectroscopy (EIS) technique of estimating the SoH of the battery 210 by sensing an internal resistance thereof. However, the above methods are merely examples and other methods may be used without departing from the spirit and scope of the illustrative examples described. The battery management apparatus 120 may estimate the SoH of the battery 210 using various other methods.

The battery management apparatus 120 may control a cooling apparatus or a heating apparatus to thermally control the battery 210 or control a voltage or current of the battery 210 on the basis of the sensed data such that internal temperature and a voltage of the battery 210 are maintained within predetermined ranges. Furthermore, the battery management apparatus 120 may prevent the battery 210 from being over-charged or over-discharged and perform cell balancing to equalize SoCs of the battery modules of the battery 210 on the basis of the SoC and/or the SoH of the battery 210. Thus, the energy efficiency and lifetime of the battery 210 may be increased.

Figure 3:
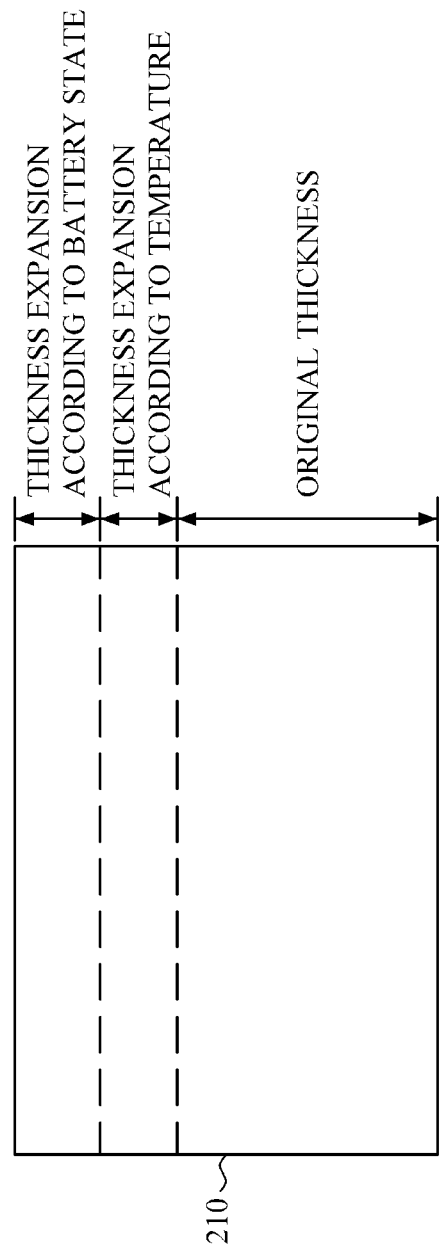
FIG. 3 is a diagram illustrating examples of factors that influence thickness expansion of a battery.

FIG. 3 is a diagram illustrating examples of factors that influence thickness expansion of a battery.

Referring to FIG. 3, factors that influence expansion of thickness of the battery include states of the battery, such as, for example, temperature, SoC, SoH of the battery. A change in the temperature of the battery may result in a change in the thickness for the battery, and a change in the state of the battery may also result in a change in the thickness for the battery. In an example, the thickness of the battery increases as the temperature of the battery increases, a charge rate of the battery increases, and the degree of deterioration of the battery increases.

Figure 4:
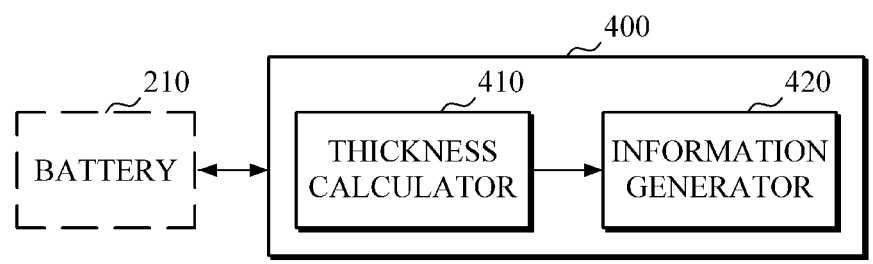
FIG. 4 is a diagram illustrating an example of a battery management apparatus.

FIG. 4 is a diagram illustrating an example of a battery management apparatus 400.

The battery management apparatus 400 of FIG. 4 is an apparatus that generates information, such as, for example, SoC, SoH of the battery 210, for estimating a state of a battery 210. The information generate by the battery management apparatus 400 is hereinafter referred to as "estimated battery-state information." In an example, the battery management apparatus 400 is an example of the battery management apparatus 120 of FIG. 1. In another example, the battery management apparatus 400 is an apparatus, which is different from the battery management apparatus 120.

As described above with reference to FIG. 3, the thickness of the battery 210 varies according to a state of the battery 210. Thus, information regarding a change in the thickness of the battery 210 according to the state may be used to estimate the state of the battery 210. In an example, the information regarding the change in the thickness of the battery 210 according to the state of the battery 210 may be used independently to estimate the state of the battery 210 or may be used to estimate the state of the battery 210 together with data sensed from the battery 210, such as, for example, temperature, voltage, current of the battery 210). In one embodiment, the battery management apparatus 400 generates estimated battery-state information. In this case, the estimated battery-state information may include information regarding a change in the thickness of the battery 210 according to the state of the battery 210.

Referring to FIG. 4, the battery management apparatus 400 includes a thickness calculator 410 and an information generator 420. The thickness calculator 210 may calculate the thickness of the battery 210 based on the capacitance of the battery 210.

Space between two flat plates with a potential difference is charged with electric charges depending on the permittivity of a dielectric substance between them. In an example, a capacitance between the two flat plates is defined by Equation 1 below.

$$C = \frac{Q}{V} = \frac{\varepsilon_0 A}{d} \qquad \text{Equation 1}$$

In Equation 1, "C" denotes the capacitance, "Q" denotes the amount of the electric charge, "V" denotes a voltage applied between the two flat plates, "$\varepsilon_0$" denotes the permittivity of the dielectric substance, "A" denotes the area of each of the two flat plates, and "d" denotes the distance between the two flat plates.

In one example, the thickness calculator 410 calculates the thickness of the battery 210 based on the capacitance of the battery 210 using Equation 1 above. As described above with reference to FIG. 2, the battery 210 may be embodied as the battery device 110 together with the first frame 220 and the second frame 230. In this case, the battery 210 may serve as the dielectric substance between the two flat plates, i.e., the first frame 220 and the second frame 230. Thus, the thickness calculator 410 may calculate the thickness "d" of the battery 210 based on the capacitance "C" of the battery 210, the area "A" of the first frame 220 or the second frame 230, and the permittivity "$\varepsilon_0$" of the battery 210 and using Equation 1.

In an example, information regarding the area "A" of the first frame 220 or the second frame 230 and information regarding the permittivity "$\varepsilon_0$" of the battery 210 is pre-stored in the battery management apparatus 400 or in an external storage device (not shown).

The information generator 420 may generate the estimated battery-state information including information regarding an increase in the thickness of the battery 210 according to the state of the battery 210 by subtracting an increase in the thickness of the battery 210 according to the temperature of the battery 210 from the thickness calculated by the thickness calculator 410. Here, examples of the state of the battery include state of the battery, such as, for example, SoC, and SoH of the battery 210. Examples of the temperature of the battery 210 may include temperature, such as, for example, localized temperature, average temperature, and temperature distribution of the battery 210.

In one example, the information generator 420 estimates the change in the thickness of the battery 210 according to the temperature of the battery 210 using temperature-thickness relation information representing the relation between the temperature and thickness of the battery 210. The information generator 420 calculates the change in the thickness of the battery 210 according to the state of the battery 210 based on the estimated change in the thickness of the battery 210 according to the temperature thereof using Equation 2 below.

$$\Delta d_s = d - \Delta d_T - d_0 \qquad \text{Equation 2}$$

In Equation 2, "$\Delta d_s$" denotes the change in the thickness of the battery 210 according to the state thereof, "d" denotes the thickness calculated by the thickness calculator 410, "$\Delta d_T$" denotes the change in the thickness of the battery 210 according to the temperature of the battery 210, and "$d_o$" denotes the original thickness of the battery 210.

The temperature-thickness relation information is expressed using various methods, such as, for example, a lookup table, and a polynomial expression. The temperature-thickness relation information may be stored beforehand in the battery management apparatus 400 or an external storage device.

Figure 5:
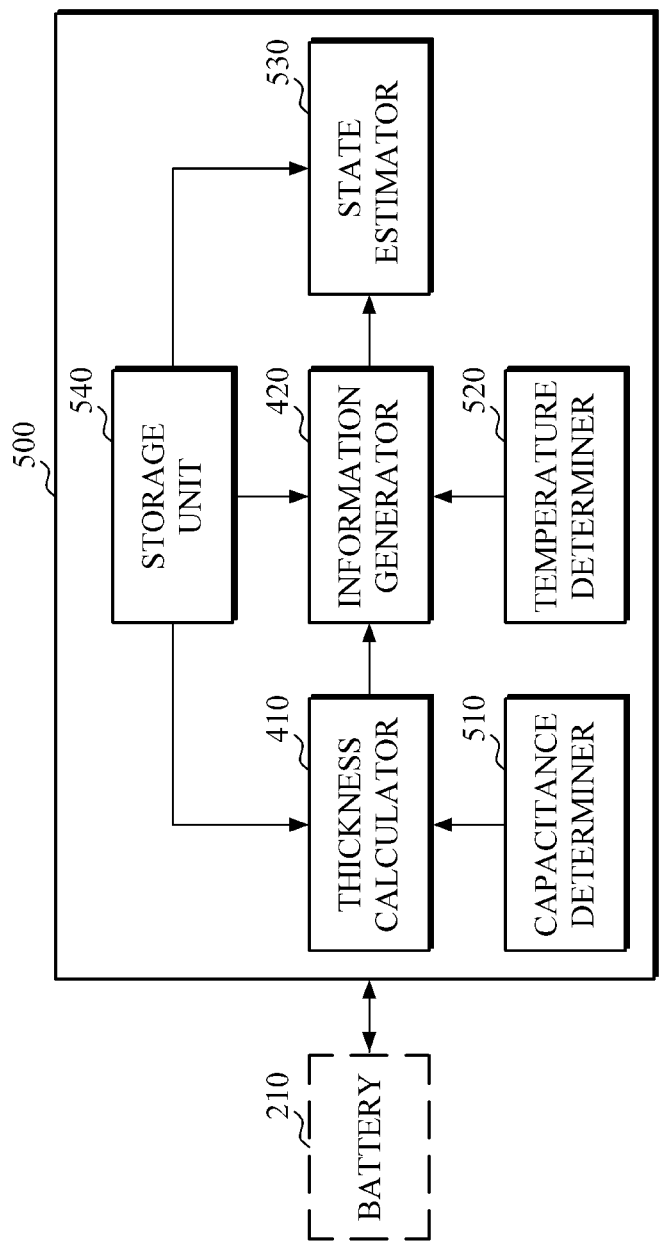
FIG. 5 is a diagram illustrating an example of a battery management apparatus.

FIG. 5 is a diagram illustrating an example of a battery management apparatus 500.

The battery management apparatus 500 of FIG. 5 may be an embodiment of the battery management apparatus 120 of FIG. 1. In an example, the battery management apparatus 500 may be embodied as a separate apparatus from the battery management apparatus 120.

Referring to FIG. 5, compared to the battery management apparatus 400 of FIG. 4, the battery management apparatus 500 may further selectively include a capacitance determiner 510, a temperature determiner 520, a state estimator 530, and a storage unit 540. In addition to the description of FIG. 5 below, the above descriptions of FIGS. 1-4, are also applicable to FIG. 5, and are incorporated herein by reference. Thus, the above description may not be repeated here.

The capacitance determiner 510 may measure a capacitance of a battery 210. For example, the capacitance determiner 510 may measure the capacitance of the battery 210 through the first frame 220 and the second frame 230. The first frame 220 and the second frame 230 are affixed to the top and the bottom of the battery 210, respectively. In an example, the capacitance determiner 510 may measure the capacitance of the battery 210 using an LCR measurement method, a reflectance method, a resonance frequency method, etc. However, these methods are merely examples and other methods may be used without departing from the spirit and scope of the illustrative examples described. The capacitance of the battery 210 may be measured using various other methods.

The temperature determiner 520 may sense or estimate temperature of the battery 210. Examples of the temperature of the battery 210 may include temperature, such as, for example, localized temperature, average temperature, and temperature distribution of the battery 210.

In one example, the temperature determiner 520 senses the localized temperature of the battery 210 using a temperature sensor attached to a portion of the battery 210.

In another example, the temperature determiner 520 may estimate the average temperature of the battery 210 on the basis of inlet/outlet temperature of cooling water used to cool the battery 210.

In another example, the temperature determiner 520 may estimate the temperature distribution of the battery 210 using a thermal management model on the basis of the localized temperature measured by the temperature sensor attached to the portion of the battery 210. The thermal management model may include models such as, for example, thermal network, 1-D model, and 2-D model. However, these methods are merely examples and other methods may be used without departing from the spirit and scope of the illustrative examples described.

The state estimator 530 estimate a state of the battery 210 on the basis of the estimated battery-state information generated by the information generator 420. In an example, state of the battery 210 may include state, such as, for example, SoC, or SoH of the battery 210.

In one example, the state estimator 530 estimates the SoC of the battery 210 using SoC-thickness relation information, which represents the relation between the SoC and the thickness of the battery 210. In one example, the state estimator 530 estimates the SoH of the battery 210 using SoH-thickness relation information, which represents the relation between the SoH and the thickness of the battery 210. In an example, the SoC-thickness relation information and the SoH-thickness relation information is expressed according to methods, such as, for example, lookup table, and polynomial expression. However, these methods are merely examples and other methods may be used without departing from the spirit and scope of the illustrative examples described.

The storage unit 540 may store information such as, for example, the temperature-thickness relation information, the SoC-thickness relation information, the SoH-thickness relation information, data sensed or measured from the battery 210 (e.g., temperature, current, a voltage, a capacitance, etc.), information regarding the permittivity of the battery 210, information regarding a cross-sectional area of the first frame 220 or the second frame 230. Furthermore, the storage unit 540 may store a program, which processes data of the battery 210 and manages the battery 210.

The storage unit 540 may include at least one of various types of storage media, such as, for example, flash memory, hard disk, multimedia card micro type storage medium, a card-type memory (e.g., SD, XD memory), random access memory (RAM), static RAM (SRAM), read-only memory (ROM), electrically erasable programmable ROM (EEPROM), programmable ROM (PROM), a magnetic memory, a magnetic disk, optical data storage devices, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions.

Figure 6:
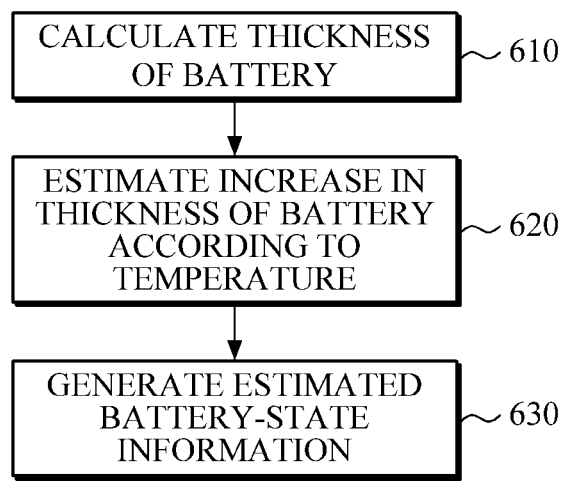
FIG. 6 is a diagram illustrating an example method of managing a battery.

FIG. 6 is a diagram illustrating an example of a method of managing a battery. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. In addition to the description of FIG. 6 below, the above descriptions of FIGS. 1-5, are also applicable to FIG. 6, and are incorporated herein by reference. Thus, the above description may not be repeated here.

Referring to FIGS. 4 and 6, in 610, the battery management apparatus 400 calculates a thickness of the battery 210 on the basis of a capacitance of the battery 210.

According to an embodiment, the battery management apparatus 400 may calculate the thickness of the battery 210 using Equation 1. As described above with reference to FIG. 2, the battery 210 may be embodied as the battery device 110 together with the first frame 220 and the second frame 230. Thus, the battery 210 may serve as a dielectric substance between two flat plates (i.e., the first frame 220 and the second frame 230). The battery management apparatus 400 may calculate the thickness "d" of the battery 210 based on the capacitance "C" of the battery 210, the area "A" of the first frame 220 or the second frame 230, and the permittivity "$\varepsilon_0$" of the battery 210 and using Equation 1.

Information regarding the area "A" of the first frame 220 or the second frame 230 and information regarding the permittivity "$\varepsilon_0$" of the battery 210 may be stored beforehand in the battery management apparatus 400 or in an external storage device.

In 620, the battery management apparatus 400 may estimate an increase in the thickness of the battery 210 according to the temperature of the battery 210. Examples of the temperature of the battery 210 may include localized temperature, average temperature, or temperature distribution of the battery 210. In one embodiment, the battery management apparatus 400 may estimate an increase in the thickness of the battery 210 according to the temperature of the battery 210 using temperature-thickness relation information representing the relation between the temperature and thickness of the battery 210.

In an example, the temperature-thickness relation information may be expressed using various methods, such as, for example, a lookup table, or a polynomial expression.

In 630, the battery management apparatus 400 generates estimated battery-state information including information regarding an increase in the thickness of the battery 210 according to a state of the battery 210 by subtracting the increase in the thickness of the battery 210 according to the temperature of the battery 210 from the thickness of the battery 210 calculated based on the capacitance of the battery 210. Examples of the state of the battery 210 may include states such as, for example, SoC, or SoH of the battery 210.

Figure 7:
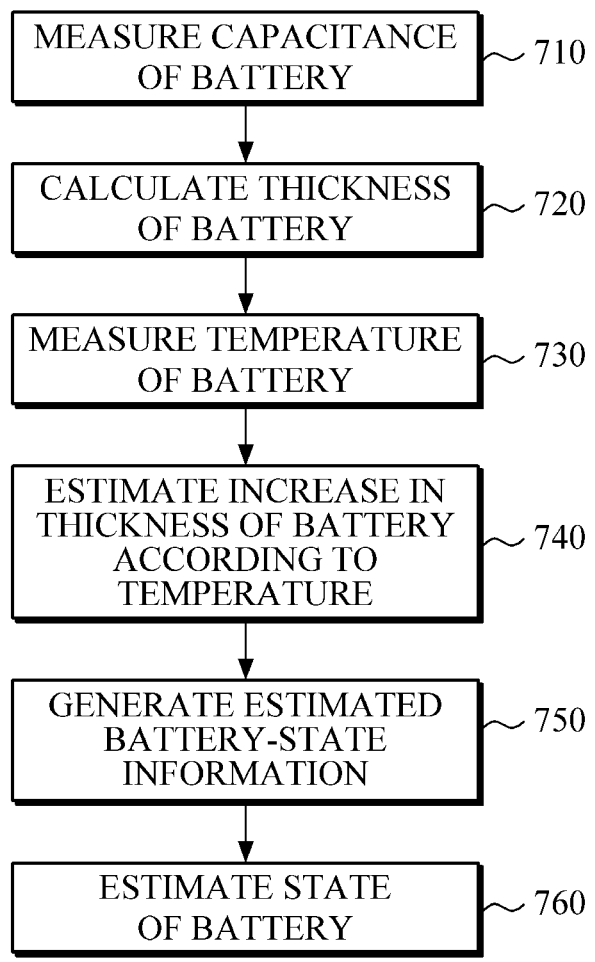
FIG. 7 is a diagram illustrating an example method of managing a battery.

FIG. 7 is a diagram illustrating an example of a method of managing a battery. The operations in FIG. 7 may be performed in the sequence and manner as shown, although the order of some operations may be changed or some of the operations omitted without departing from the spirit and scope of the illustrative examples described. Many of the operations shown in FIG. 7 may be performed in parallel or concurrently. In addition to the description of FIG. 7 below, the above descriptions of FIGS. 1-6, are also applicable to FIG. 7, and are incorporated herein by reference. Thus, the above description may not be repeated here.

Referring to FIGS. 5 and 7, in 710, the battery management apparatus 500 measures a capacitance of the battery 210. For example, the battery management apparatus 500 measures the capacitance of the battery 210 through the first frame 220 affixed to the top of the battery 210 to fix the battery 210 and the second frame 230 that is affixed to the bottom of the battery 210 to fix the battery 210. In an example, the first frame 220 and the second frame 230 are closely affixed to the top and the bottom of the battery 210, respectively. In an example, the battery management apparatus 500 measure the capacitance of the battery 210 using methods, such as, for example, the LCR measurement method, the reflectance method, and the resonance frequency method. However, these methods are merely examples and other methods may be used without departing from the spirit and scope of the illustrative examples described.

In 720, the battery management apparatus 500 may calculate the thickness of the battery 210 on the basis of the capacitance of the battery 210. In one embodiment, the battery management apparatus 500 may calculate the thickness of the battery 210 using Equation 1.

In 730, the battery management apparatus 500 may sense or measure temperature of the battery 210. In an example, the temperature of the battery 210 is one or more of localized temperature, average temperature, and temperature distribution of the battery 210.

In one example, the battery management apparatus 500 senses the localized temperature of the battery 210 using a temperature sensor attached to a portion of the battery 210.

In another example, the battery management apparatus 500 estimates the average temperature of the battery 210 on the basis of inlet/outlet temperature of cooling water used to cool the battery 210.

In another example, the battery management apparatus 500 may estimate the temperature distribution of the battery 210 using a thermal management model on the basis of the localized temperature measured by the temperature sensor attached to a portion of the battery 210. Examples of the thermal management model include models such as, for example, thermal network, 1-D model, and 2-D model. However, these methods are merely examples and other methods may be used without departing from the spirit and scope of the illustrative examples described.

In 740, the battery management apparatus 500 estimates an increase in the thickness of the battery 210 according to the temperature of the battery 210. In an example, the battery management apparatus 500 may estimate an increase in the thickness of the battery 210 according to the temperature of the battery 210 using temperature-thickness relation information representing the relation between the temperature and thickness of the battery 210.

In 750, the battery management apparatus 500 generates estimated battery-state information including information regarding an increase in the thickness of the battery 210 according to a state of the battery 210. The battery management apparatus 500 generates estimated battery-state information by subtracting the increase in the thickness of the battery 210 according to the temperature from the thickness of the battery 210 calculated on the basis of the capacitance.

In 760, the battery management apparatus 500 estimates the state of the battery 210 on the basis of the estimated battery-state information. Examples of the state of the battery 210 includes states such as, for example, SoC, and SoH of the battery 210. For example, the battery management apparatus 500 may estimate the SoC of the battery 210 using SoC-thickness relation information representing the relation between of the SoC and the thickness of the battery 210 and estimate the SoH of the battery 210 using SoH-thickness relation information representing the relation between the SoH and the thickness of the battery 210. The SoC-thickness relation information and the SoH-thickness relation information is expressed using various methods, such as, for example, a lookup table, and a polynomial expression.

The battery management apparatuses 120, 400, 500, thickness calculator 410, information generator 420, capacitance determiner 510, temperature determiner 520, state estimator 530, and storage unit 540 described in FIGS. 1 and 4-5 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 5-6 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery management apparatus comprising:
   a thickness calculator configured to calculate a thickness of a battery based on a capacitance of the battery;
   an information generator configured to generate a battery-state information by subtracting an increase in a thickness of the battery according to temperature of the battery from the calculated thickness; and
   a state estimator configured to estimate a state of the battery based on the battery-state information, wherein the state estimator is further configured to estimate a state-of-charge (SoC) of the battery using SoC-thickness relation information representing a relation between the SoC and the thickness of the battery, and to estimate a state-of-health (SoH) of the battery using SoH-thickness relation information representing a relation between the SoH and the thickness of the battery,
   wherein the information generator is further configured to determine the increase in the thickness of the battery according to the temperature of the battery using temperature-thickness relation information representing a relation between the temperature and the thickness of the battery.

2. The battery management apparatus of claim 1, further comprising:
   a capacitance determiner configured to measure the capacitance of the battery through a first frame coupled to a top of the battery and a second frame coupled to a bottom of the battery.

3. The battery management apparatus of claim 2, wherein the first frame and the second frame comprises one of a cooling channel, a fixed frame, a heat conductive plate, and a phase-change material (PCM) cooling plate.

4. The battery management apparatus of claim 2, wherein the first frame and the second frame are configured to fix a position of the battery.

5. The battery management apparatus of claim 1, wherein the temperature of the battery comprises any one or any combination of a localized temperature, an average temperature, and a temperature distribution of the battery.

6. The battery management apparatus of claim 1, wherein the state of the battery comprises one of the SoC or the SoH of the battery.

7. The battery management apparatus of claim 1, wherein:
   the capacitance of the battery is determined using a first frame coupled to a top of the battery, a second frame coupled to a bottom of the battery, and a third frame coupled to a side of the battery; and
   the temperature of the battery is determined using one or more temperature sensors attached to the battery.

8. A battery management method comprising:
   calculating a thickness of a battery based on a capacitance of the battery;
   determining the increase in the thickness of the battery according to the temperature of the battery using temperature-thickness relation information representing a relation between the temperature and the thickness of the battery;
   generating battery-state information by subtracting an increase in a thickness of the battery according to temperature of the battery from the calculated thickness; and
   estimating a state of the battery based on the battery-state information,
   wherein the estimating the state of the battery based on the battery-state information includes estimating a state-of-charge (SoC) of the battery using SoC-thickness relation information representing a relation between the SoC and the thickness of the battery, and estimating a state-of-health (SoH) of the battery using SoH-thickness relation information representing a relation between the SoH and the thickness of the battery.

9. The method of claim 8, further comprising:
measuring the capacitance of the battery through a first frame coupled to a top of the battery and a second frame coupled to a bottom of the battery.

10. The method of claim 9, wherein the first frame and the second frame comprises one of a cooling channel, a fixed frame, a heat conductive plate, and a phase-change material (PCM) cooling plate.

11. The method of claim 8, wherein the temperature of the battery comprises any one or any combination of a localized temperature, an average temperature, and a temperature distribution of the battery.

12. The method of claim 8, wherein the state of the battery comprises one of the SoC or the SoH of the battery.

13. A non-transitory computer-readable storage medium storing instructions that, when executed by a processor, cause the processor to perform the method of claim 8.

* * * * *